(12) United States Patent
Theiss et al.

(10) Patent No.: US 8,610,119 B2
(45) Date of Patent: Dec. 17, 2013

(54) STABILITY ENHANCEMENTS IN METAL OXIDE SEMICONDUCTOR THIN FILM TRANSISTORS

(75) Inventors: Steven D. Theiss, Woodbury, MN (US); David H. Redinger, Oakdale, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 167 days.

(21) Appl. No.: 13/141,118

(22) PCT Filed: Dec. 4, 2009

(86) PCT No.: PCT/US2009/066740
§ 371 (c)(1),
(2), (4) Date: Jun. 21, 2011

(87) PCT Pub. No.: WO2010/074927
PCT Pub. Date: Jul. 1, 2010

(65) Prior Publication Data
US 2011/0253998 A1    Oct. 20, 2011

Related U.S. Application Data

(60) Provisional application No. 61/140,659, filed on Dec. 24, 2008.

(51) Int. Cl.
*H01L 29/22* (2006.01)
*H01L 21/44* (2006.01)
*H01L 21/36* (2006.01)

(52) U.S. Cl.
USPC .............. 257/43; 257/E21.476; 257/E21.461; 257/E29.095; 438/104

(58) Field of Classification Search
USPC .............. 257/43, E21.476, E21.461, E29.005; 438/104
See application file for complete search history.

(56) References Cited

U.S. PATENT DOCUMENTS

| | | |
|---|---|---|
| 3,304,469 A | 2/1967 | Weimer |
| 5,273,920 A | 12/1993 | Kwasnick |
| 7,205,640 B2 | 4/2007 | Yoshioka |
| 7,242,039 B2 | 7/2007 | Hoffman |
| 7,547,591 B2 | 6/2009 | Hoffman |
| 2008/0035920 A1 | 2/2008 | Takechi |
| 2008/0038882 A1 | 2/2008 | Takechi |
| 2008/0258141 A1 | 10/2008 | Park |

FOREIGN PATENT DOCUMENTS

EP    0486047    5/1992

OTHER PUBLICATIONS

Arai, "Aluminum-based gate structure for active-matrix liquid crystal displays", IBM J. Res. Develop., May/Jul. 1998, vol. 42, No. 3-4, pp. 491-499.

(Continued)

*Primary Examiner* — Long Pham
(74) *Attorney, Agent, or Firm* — Jean A. Lown

(57) ABSTRACT

A plasma hydrogenated region in the dielectric layer of a semiconductor thin film transistor (TFT) structure improves the stability of the TFT. The TFT is a multilayer structure including an electrode, a dielectric layer disposed on the electrode, and a metal oxide semiconductor on the dielectric. Exposure of the dielectric layer to a hydrogen containing plasma prior to deposition of the semiconductor produces a plasma hydrogenated region at the semiconductor-dielectric interface. The plasma hydrogenated region incorporates hydrogen which decreases in concentration from semiconductor/dielectric interface into the bulk of one or both of the dielectric layer and the semiconductor layer.

20 Claims, 5 Drawing Sheets

(56) References Cited

OTHER PUBLICATIONS

Bae, "Effects of Deuterium-Plasma Treatment at the a-Si:H/a-SiN:H Interface on the Field-Effect Mobility of a Thin-Film Transistor", Journal of the Korean Physical Society, Dec. 2002, vol. 41, No. 6, pp. 1063-1067.

Bae, "Mobility Enhancement in ZnO-based TFTs by H Treatment", Electrochemical and Solid-State Letters, 2004, vol. 7, No. 11, pp. G279-G281.

Carcia, "Oxide engineering of ZnO thin-film transistors for flexible electronics", Journal of the SID, 2005, vol. 13, No. 7, pp. 547-554.

Carcia, "A comparison of zinc oxide thin-film transistors on silicon oxide and silicon nitride gate dielectrics", Journal of Applied Physics, 2007, vol. 102, pp. 074512-1-074512-7.

Kang, "Gate dielectric surface treatment techniques for organic thin film transistor", Microelectronic Engineering, 2007, vol. 84, pp. 1503-1506.

Remashan, "Impact of Hydrogenation of ZnO TFTs by Plasma-Deposited Silicon Nitride Gate Dielectric", IEEE Transactions on Electron Devices, Oct. 2008, vol. 55, No. 10, pp. 2736-2743.

International Search Report for PCT/US2009/066740, 4 pages.

STABILITY ENHANCEMENTS IN METAL OXIDE SEMICONDUCTOR THIN FILM TRANSISTORS

CROSS REFERENCE TO RELATED APPLICATIONS

This application is a national stage filing under 35 U.S.C. 371 of PCT/US2009/066740, filed Dec. 4, 2009, which claims priority to Provisional Application No. 61/140,659, filed Dec. 24, 2008, the disclosure of which is incorporated by reference in its/their entirety herein.

TECHNICAL FIELD

The present invention is related to systems and methods useful in fabricating thin film structures.

BACKGROUND

Metal oxide semiconductors, such as zinc oxide (ZnO) and indium gallium zinc oxide (InGaZnO) are attractive for device fabrication due to their high carrier mobility, low processing temperatures, and optical transparency. Thin film transistors (TFTs) made from metal oxide semiconductors are particularly useful in active-matrix addressing schemes for optical displays. The low processing temperature of metal oxide semiconductors allows the formation of display backplanes on inexpensive plastic substrates such as polyethylene terephthalate (PET) and polyethylene naphthalate (PEN). The transparency of oxide semiconductor TFTs leads to improved pixel apertures and brighter displays. In contrast, amorphous silicon (a-Si) TFTs reduce pixel aperture because a-Si devices are light sensitive and must be shielded from the light.

Although metal oxide semiconductor TFTs have great potential due to their transparency and the potential for high performance devices formed at or near room temperatures, fabrication of stable devices remains a challenge. Metal oxide semiconductor TFTs may exhibit hysteresis in their characteristics as a function of gate-bias. Development of metal oxide semiconductor technology is ongoing, and current efforts are focused on reducing or eliminating hysteresis to enhance TFT stability. The present invention fulfils these and other needs, and offers other advantages over the prior art.

SUMMARY

Embodiments of the invention are directed to thin film electronic structures and methods for fabricating the thin film structures. One embodiment of the invention involves a method of fabricating a multilayer semiconductor structure. An electrode layer, e.g., a gate electrode, is formed on a substrate and a dielectric layer is formed proximate to the electrode layer. After forming the dielectric layer, the dielectric layer is exposed to a hydrogen-containing plasma. After exposing the dielectric layer to the hydrogen containing plasma, a metal oxide semiconductor layer is formed proximate to the dielectric layer.

Another embodiment of the invention involves a method for making a metal oxide semiconductor device. The process involves forming an electrode layer and forming a dielectric layer on the electrode layer. After forming the dielectric layer, the dielectric layer is processed to create a non-uniform hydrogen profile in a hydrogenated region at the surface of the dielectric layer. The concentration of hydrogen in the hydrogenated region is relatively high at the surface of the dielectric and the hydrogen concentration in the hydrogenated region decreases within the bulk of the dielectric layer. After exposing the dielectric layer to the hydrogen containing plasma, a semiconductor layer comprising a metal oxide semiconductor is formed over the dielectric layer.

Yet another embodiment is directed to a multilayer semiconductor structure. The multilayer semiconductor structure includes an electrode and a dielectric layer disposed proximate to the electrode. The multilayer semiconductor structure also includes a semiconductor layer comprising a metal oxide semiconductor formed proximate to the dielectric. A hydrogenated region is formed at a semiconductor-dielectric interface of the dielectric layer. The hydrogen concentration of the hydrogenated layer is relatively high at the semiconductor-dielectric interface and the hydrogen concentration decreases in concentration from the semiconductor-dielectric interface into one or both of the dielectric layer and the semiconductor layer.

The above summary of the present invention is not intended to describe each embodiment or every implementation of the present invention. Advantages and attainments, together with a more complete understanding of the invention, will become apparent and appreciated by referring to the following detailed description and claims taken in conjunction with the accompanying drawings.

Figure 1:
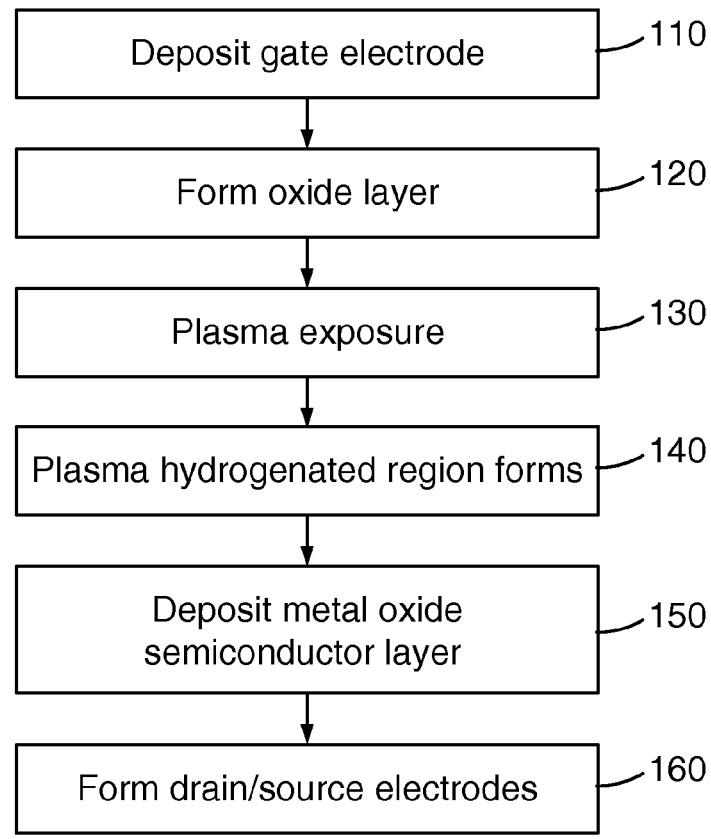
FIG. 1 is a flow diagram illustrating a process for fabricating metal oxide semiconductor thin film transistors using plasma exposure in accordance with embodiments of the invention.

While the invention is amenable to various modifications and alternative forms, specifics thereof have been shown by way of example in the drawings and will be described in detail. It is to be understood, however, that the intention is not to limit the invention to the particular embodiments described. On the contrary, the intention is to cover all modifications, equivalents, and alternatives falling within the scope of the invention as defined by the appended claims.

DETAILED DESCRIPTION

In the following description of various exemplary embodiments, reference is made to the accompanying drawings which form a part hereof, and in which is shown by way of illustration various embodiments in which the invention may be practiced. It is to be understood that other embodiments may be utilized, and structural and operational changes may be made without departing from the scope of the present invention.

Metal oxide semiconductors, such as zinc oxide (ZnO) and related alloys such as indium gallium zinc oxide (InGaZnO), have recently generated great interest as the active layer of transparent thin film transistors (TFTs). This group of semiconductors can be processed at room temperature to create flexible circuits including transparent transistors which have high carrier mobility, making them potentially ideal for many display applications. However, in order to fully exploit these desirable characteristics, techniques to enhance the stability of the devices are needed. Metal oxide semiconductor TFTs may exhibit instability in their current-voltage transfer characteristics and threshold voltage $V_T$ due to a gate-bias induced hysteresis. Approaches described herein mitigate this hysteresis and also improve overall TFT operation.

Embodiments of the invention are directed to methods for enhancing the stability of metal oxide semiconductor TFTs by exposure of the gate dielectric to a hydrogen-containing plasma. The methods described are cost effective and relatively easy to control, and are particularly advantageous for roll-to-roll fabrication. The approaches discussed herein involve exposure of at least the dielectric layer of the TFT to a hydrogen-containing plasma prior to deposition of the metal oxide semiconductor, e.g., ZnO, InGaZnO, InZnO, ZnSnO, and/or other metal oxide semiconductors. Plasma exposure of the dielectric creates a plasma hydrogenated region at least within the dielectric layer at the semiconductor-dielectric interface and may extend into the dielectric layer and/or the semiconductor layer. The plasma hydrogenated region significantly stabilizes the gate-bias transfer characteristics and the threshold voltage shift of the devices and also improves carrier mobility, thereby enhancing overall TFT performance.

The use of a hydrogen containing plasma to reduce the threshold voltage hysteresis of metal oxide semiconductors was previously unknown. The effect of hydrogen exposure at the dielectric surface on the carrier mobility of these types of metal oxide semiconductor TFTs which are fabricated at low temperatures was also unexpected. Increases in carrier mobility for a-Si TFTs has been linked to a decrease in the surface roughness of the dielectric which may be modified by plasma exposure. However, a change in the dielectric surface roughness does not fully explain the carrier mobility and/or stability improvements shown by the plasma exposed metal oxide semiconductor TFTs, particularly in view of the fact that these devices are formed using low temperature processes.

Hydrogenation of silicon nitride gate dielectrics during plasma enhanced chemical vapor deposition (PECVD) has been shown to increase carrier mobility in metal oxide semiconductor TFTs over similar TFTs formed using non-PECVD gate dielectrics, or PECVD gate dielectrics containing reduced levels of hydrogen. The increase in carrier mobility in the TFTs with PECVD SiN dielectrics containing increased levels of hydrogen may be attributed to defect passivation in the channel as the high concentration of hydrogen in the dielectric diffuses into the semiconductor.

Hydrogenation of the gate dielectric during formation via PECVD differs in both process and resulting structure from hydrogen-containing plasma exposure after dielectric formation. The PECVD process hydrogenates the dielectric bulk as the dielectric is deposited and does not modify the surface of a previously formed dielectric to create a plasma hydrogenated region at the dielectric surface. Alteration of the bulk dielectric characteristics would occur in conjunction with any modification of the PECVD process to achieve specific surface treatments. Plasma hydrogenation after dielectric formation allows the achievement of specific surface characteristics without modifying the dielectric bulk characteristics. Furthermore, plasma hydrogenation of the dielectric surface may be achieved with or without significant bulk hydrogenation of the dielectric.

FIG. 1 is a flow diagram illustrating fabrication of one configuration of a metal oxide semiconductor TFT in accordance with embodiments of the invention. The TFT gate electrode is formed 110 on a substrate. The substrate may be a rigid or flexible, transparent or opaque material, such as glass, metal or plastic. Flexible substrates allow fabrication by roll to roll processing which generally reduces manufacturing costs. Low cost flexible substrates may comprise a polymer material such as PEN or PET. Polymers are desirable for display applications because of their optical transparency. These substrate materials are sensitive to temperature making low temperature processing desirable. Metal foil is also a suitable flexible substrate for some applications.

The gate electrode can be made of any electrically conductive material, with aluminum (Al) magnesium (Mg), tantalum (Ta), titanium (Ti), molybdenum (Mo), tungsten (W), and chromium (Cr) being of particular interest. The gate electrode may comprise a metal alloy, a conductive metal oxide, or a doped semiconductor. Aluminum (Al) and aluminum-based alloys are frequently used for circuit metallization because these materials are relatively inexpensive, can be deposited by a number known deposition processes, and are well suited to thin film applications. Suitable gate electrode deposition/patterning techniques include traditional photolithography, metal evaporation through a shadow mask, and/or other techniques known in the art.

A dielectric layer is formed 120 on the gate electrode, such as by anodizing the gate material and/or by depositing a dielectric layer over the gate. For example, in one implementation, aluminum is used to form the gate electrode which is then anodized to form an $Al_2O_3$ layer which serves as the dielectric layer for the transistor. In some implementations, the dielectric layer may include a number of sublayers. For example, a sputtered $SiO_2$ layer (or other dielectric) may be deposited on an anodized $Al_2O_3$ layer to form the gate dielectric.

The gate dielectric is exposed 130 to a plasma containing hydrogen gas. In some implementations, the plasma includes a gas containing hydrogen and argon with a hydrogen content of at least about 5%. In other implementations, the plasma may include deuterium. In one embodiment, plasma exposure involves a 5% hydrogen/95% argon gas applied at a power density of at least about 0.01 Watts/cm$^2$ for at least about 3-5 minutes.

Exposure of the gate dielectric to the hydrogen-containing plasma leads to the formation 140 of a hydrogenated region at and/or near the surface of the dielectric. In the hydrogenated region, hydrogen is concentrated at the dielectric surface and the concentration of hydrogen decreases from the surface of the dielectric layer into the bulk of the dielectric layer. The hydrogen concentration decreases from a first level at the surface of the dielectric layer to a second, lower, level within the bulk of the dielectric layer. After the hydrogen containing plasma exposure, the metal oxide semiconductor is deposited 150 over the dielectric layer and the drain and source electrodes are formed 160. The TFT fabrication steps 110-160 may proceed at a temperature of less than about 100 C, and may be carried out at room temperature. Experiments show that the hydrogenated region significantly enhances carrier mobility and improves threshold voltage stability in metal oxide semiconductor TFTs. Any one or more of the processes 110-160 illustrated by FIG. 1 may be implemented on a flexible substrate using a roll-to-roll manufacturing process.

Figure 2:
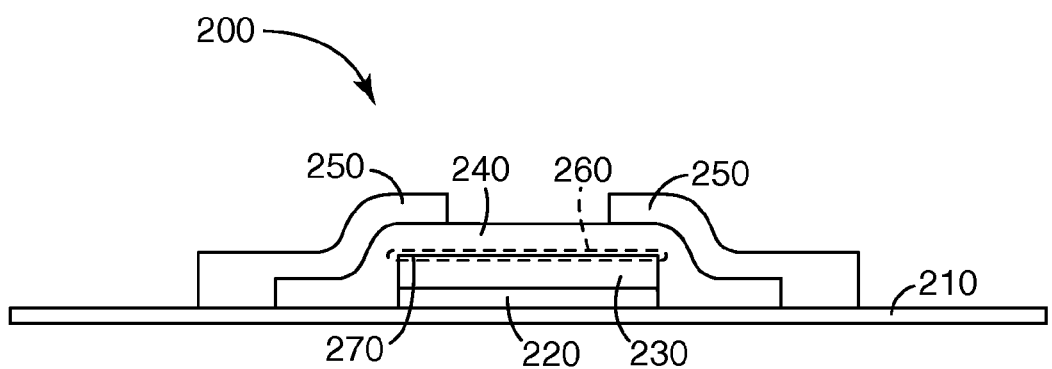
FIG. 2 is a cross section of a device including a plasma hydrogenated region in accordance with embodiments of the invention.

FIG. 2 is a cross sectional view of a multilayer TFT fabricated by the process described above. The device depicted in FIG. 2 represents a particular arrangement of the component layers of the TFT. Those skilled in the art will recognize that various other configurations are also possible. For example, the TFT may be built up with the drain and source electrodes initially deposited on the substrate with the semiconductor, dielectric, and gate layers arranged thereon to form a TFT. All variations of TFT configurations that allow formation of a hydrogenated region of the gate dielectric as described herein are contemplated as being within the scope of the present invention.

The device 200 is formed on a substrate 210 that is typically insulative and may be transparent and/or flexible as previously discussed. A gate conductor (i.e., gate electrode) 220 is disposed on the substrate 210. A dielectric layer 230 is disposed on the gate conductor 220 and a metal oxide semiconductor layer 240 is disposed on the dielectric layer 230. Drain and source electrodes 250 are arranged on the metal oxide semiconductor layer 240. As a result of the hydrogen containing plasma exposure, a plasma hydrogenated region 260 is formed at and/or near the interface of the dielectric 230 and semiconductor 240 layers. The plasma hydrogenated region 260 includes a region of hydrogen concentrated at the interface which may extend into one or both of the dielectric layer 230 and the metal oxide semiconductor 240 layer. If the hydrogen extends into the bulk dielectric or semiconductor, one or both of the dielectric layer 230 and the semiconductor layer 240 exhibit a non-uniform hydrogen concentration profile. For example, within the hydrogenated region 260, the hydrogen content is non-uniform, decreasing from a relatively high concentration at the dielectric-semiconductor interface 270 with decreasing concentration into the bulk dielectric 230. A similar non-uniform hydrogen concentration profile may be found within the metal oxide semiconductor, wherein the hydrogen concentration decreases from the interface into the bulk semiconductor

EXAMPLE 1

FIGS. 3A-3D are secondary ion mass spectroscopy (SIMS) plots for $ZnO$—$Al_2O_3$ structures exposed to deuterium ($D_2$) plasma for various lengths of time after the formation of the $Al_2O_3$ layer and prior to the deposition of the ZnO layer. Graph 3A depicts a TFT control sample (Sample A) that is not exposed to the deuterium plasma. As expected, the ZnO concentration 310 is substantially constant through the ZnO semiconductor region, and decreases at the $ZnO$—$Al_2O_3$ interface 312. The $Al_2O_3$ graph 315 illustrates that the $Al_2O_3$ concentration increases at the $ZnO$—$Al_2O_3$ interface and is substantially constant in the bulk of the $Al_2O_3$. The sample depicted in FIG. 3A was not exposed to deuterium plasma, and as a result, the $D_2$ concentration remains flat in the ZnO and $Al_2O_3$ regions.

Figure 3A:
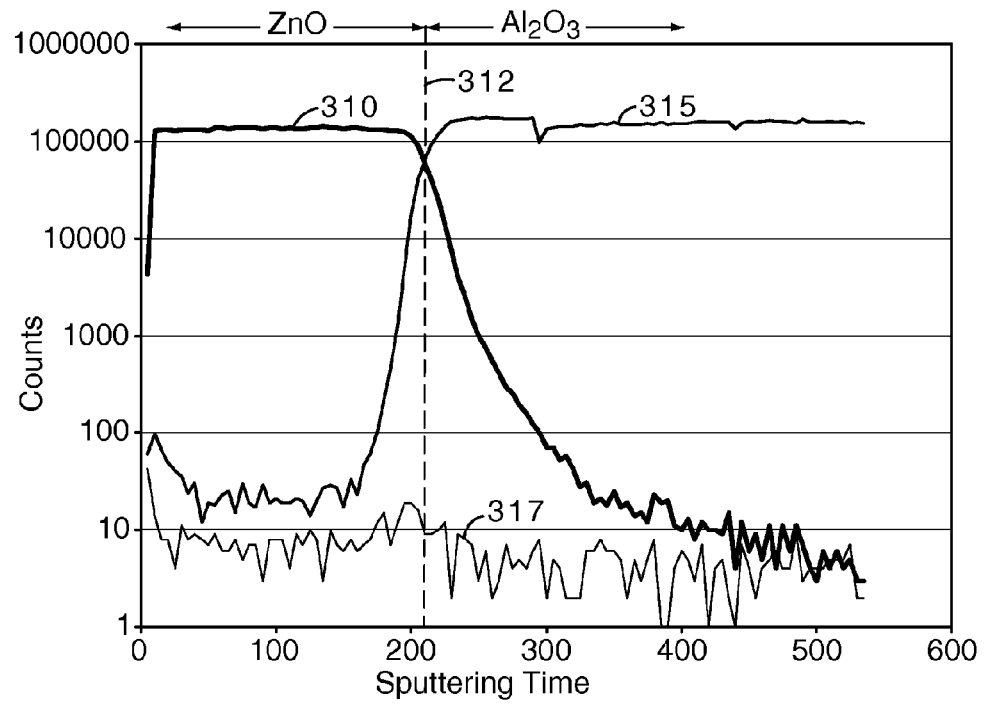
FIGS. 3A-3D are secondary ion mass spectroscopy (SIMS) plots for four ZnO—$Al_2O_3$ sample structures exposed to deuterium ($D_2$) plasma for various lengths of time in accordance with embodiments of the invention.
Figure 3B:
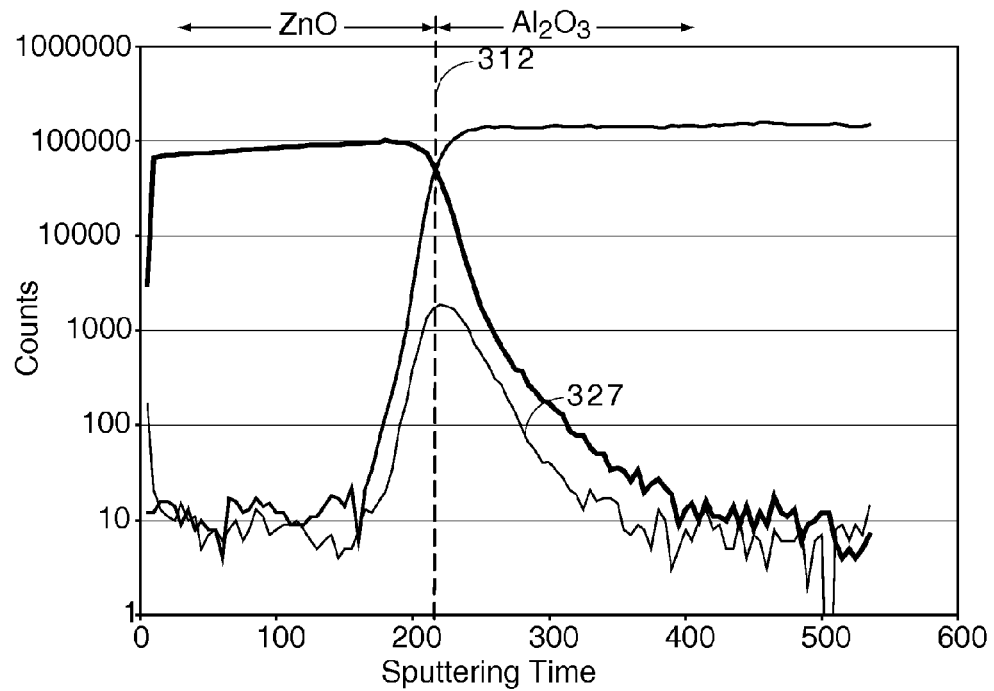
Figure 3C:
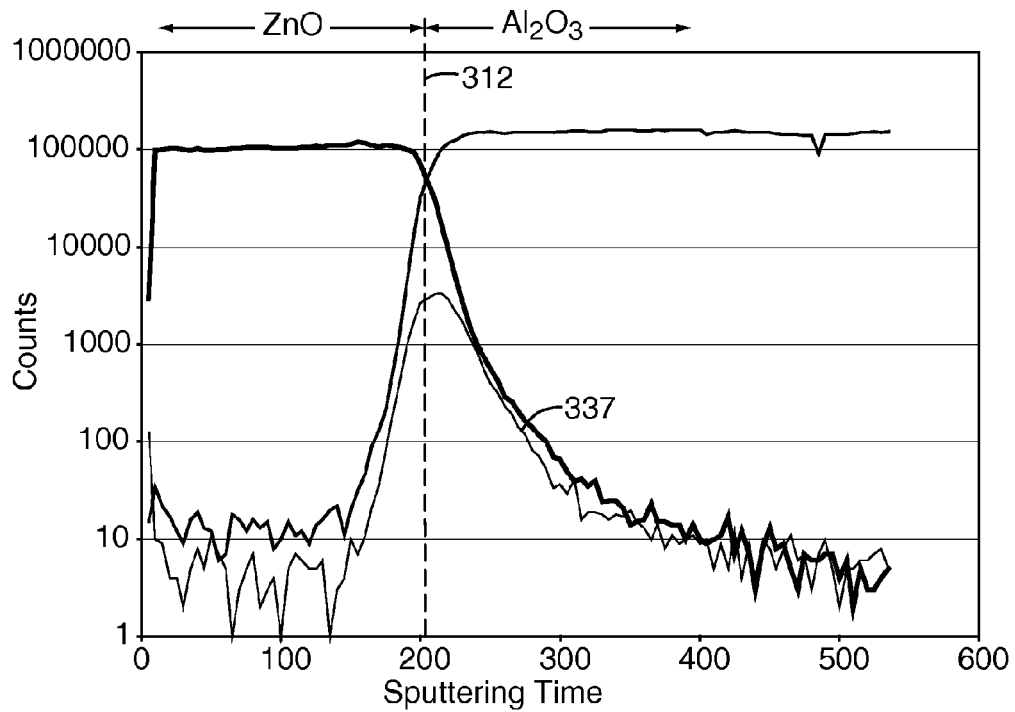
Figure 3D:
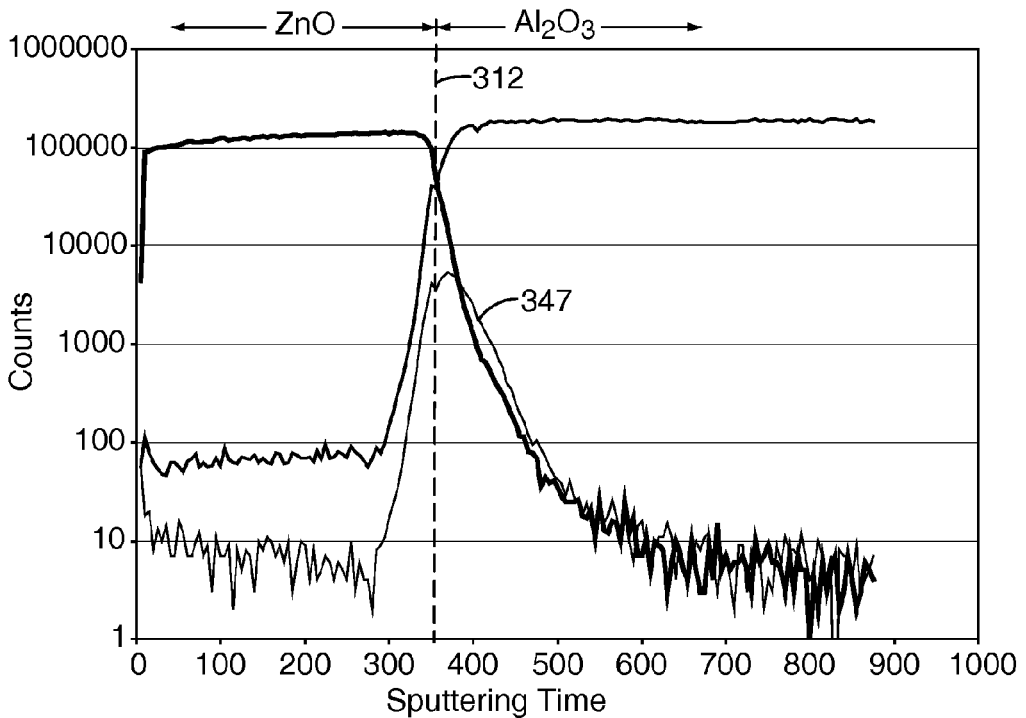

FIGS. 3B, 3C and 3D illustrate three $ZnO$—$Al_2O_3$ sample TFT structures (Samples B, C, and D) with $Al_2O_3$ layer exposure to 5% $D_2$/Ar plasma at 500 W for 2 minutes, 5 minutes, and 10 minutes respectively. For each sample, the $D_2$ concentration, illustrated by graphs 327, 337 and 347, respectively, rises at the $ZnO$—$Al_2O_3$ interface 312 and decreases into the bulk of the $Al_2O_3$. The hydrogen concentration profiles become broader with time of deuterium plasma exposure as illustrated by the graphs 327, 337, and 347.

Figure 4:
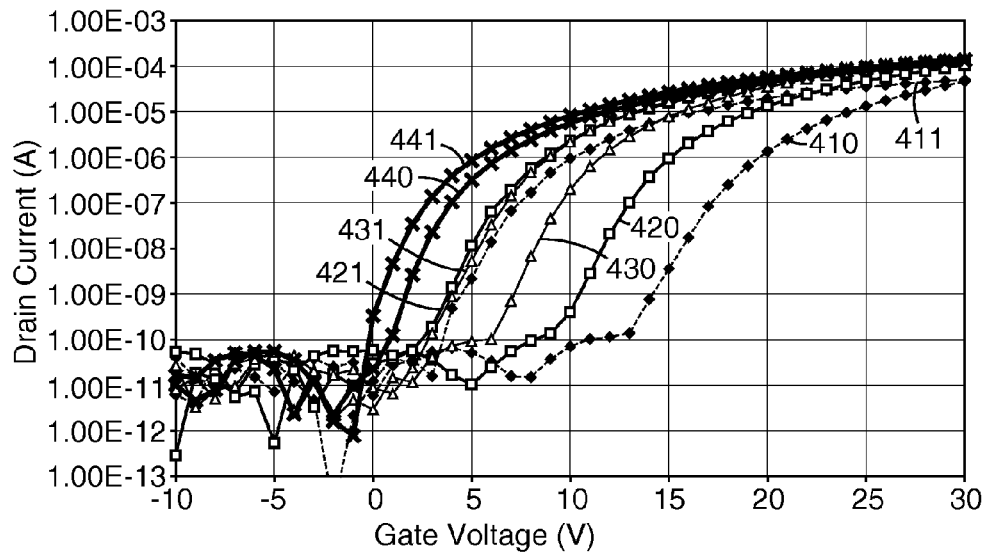
FIG. 4 shows current-voltage plots (forward and reverse sweeps) for the samples of FIGS. 3A-3D which demonstrate the improvement of the threshold voltage, stability with increasing $D_2$ plasma exposure.

FIG. 4 shows overlay graphs of the current-voltage transfer characteristics for Samples A, B, C, and D which illustrate the improvement of the threshold voltage stability with increasing $D_2$ plasma exposure. Graphs 410 and 411 are the forward and reverse voltage sweeps, respectively, for Sample A (no plasma exposure); Graphs 420 and 421 are the forward and reverse voltage sweeps, respectively, for Sample B (2 minute $D_2$ plasma exposure); Graphs 430 and 431 are the forward and reverse voltage sweeps, respectively, for Sample C (5 minute $D_2$ plasma exposure); and Graphs 440 and 441 are the forward and reverse voltage sweeps, respectively, for Sample D (10 minute plasma exposure). Note that the instability in the Sample A is manifested as an undesirable positive shift in the threshold voltage between the forward and reverse gate voltage sweeps. The stability of the samples increased with $D_2$ exposure. Note the minimal hysteresis between the forward 440 and reverse 441 traces for Sample D which was exposed to $D_2$ plasma for 10 minutes. The carrier mobility for the $D_2$ plasma exposed TFTs (Samples B, C, and D) were also increased over the carrier mobility of the TFT that was not exposed to the $D_2$ plasma.

EXAMPLE 2

After depositing and patterning an aluminum gate metal according to standard fabrication procedure, the gate metal was anodized to the desired thickness of the $Al_2O_3$, typically about 100 nm (75V). After anodization, the device was exposed to a forming gas plasma of Ar—$H_2$ composed of 95% argon and 5% hydrogen. The plasma exposure was performed at 500 W, typically for about 3-5 minutes. The sample was placed on a grounded electrode platen during the plasma exposure. The frequency of the plasma system is about 40 kHz. After the plasma exposure, ZnO deposition was performed. Standard processing was then used to complete fabrication of the sample.

Figure 5:
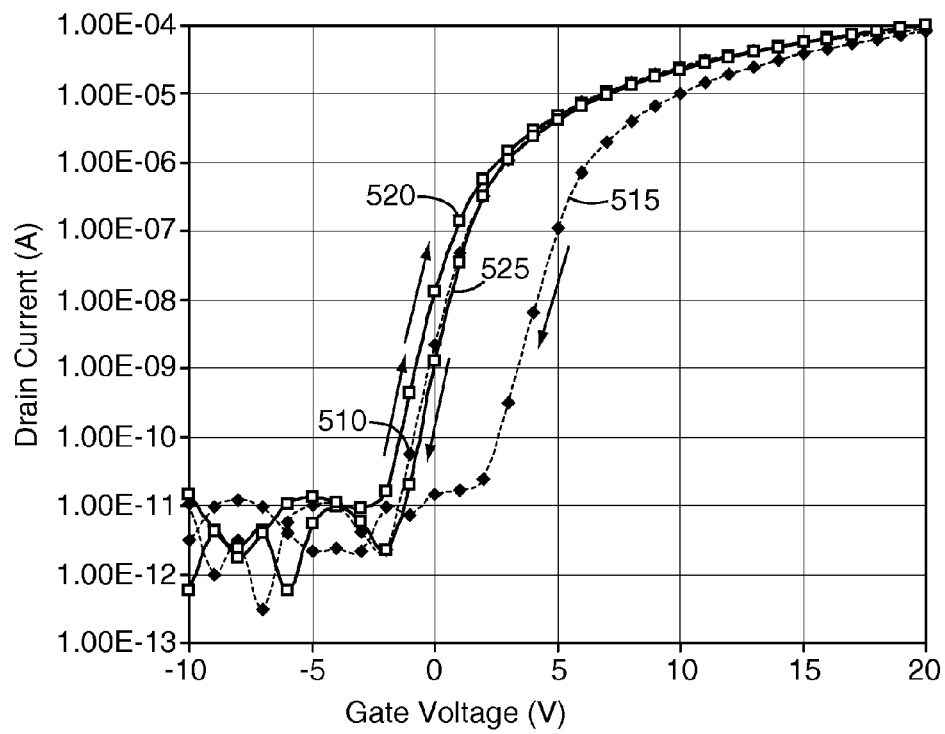
FIG. 5 shows current-voltage plots (forward and reverse sweeps) for a TFT having an anodized $Al_2O_3$ dielectric which demonstrate the improvement in stability and performance obtained by hydrogen plasma exposure in accordance with embodiments of the invention.

FIG. 5 shows current-voltage transfer characteristics demonstrating the improvement in stability and performance obtained by the hydrogen plasma treatment. The plot shows the current-voltage plots of two TFTs made with 520, 525 and without 510, 515 the Ar—$H_2$ plasma treatment described above. Note the large hysteresis between the forward 510 and reverse 515 current traces for the TFT with no plasma treatment. This instability is manifested as an undesirable positive shift in the threshold voltage. The second set of current traces 520, 525 is from an otherwise identical TFT on the same substrate except that the second TFT was exposed to the Ar—$H_2$ plasma according to the process described herein. Note the minimal hysteresis between the forward 520 and reverse 525 traces for the plasma exposed TFT. The carrier mobility for the hydrogen plasma exposed TFT was also increased over that of the TFT that was not exposed to the hydrogen plasma.

EXAMPLE 3

After depositing an aluminum gate metal according to standard fabrication procedure, the gate metal was anodized to the desired thickness of the $Al_2O_3$, typically about 100 nm (75V). After anodization, about a 20 nm thick layer of $SiO_2$ was RF-sputter deposited on top of the surface of the anodized $Al_2O_3$ layer. After deposition of the $SiO_2$ layer, the device was exposed to a forming gas plasma of Ar—$H_2$ composed of 95% argon and 5% hydrogen. The plasma exposure was performed at 500 W, typically for about 3-5 minutes. The sample was placed on a grounded electrode platen during the plasma exposure. The frequency of the plasma system is about 40 kHz. After the plasma exposure, ZnO deposition was performed. Standard processing was then used to complete fabrication of the sample.

Figure 6:
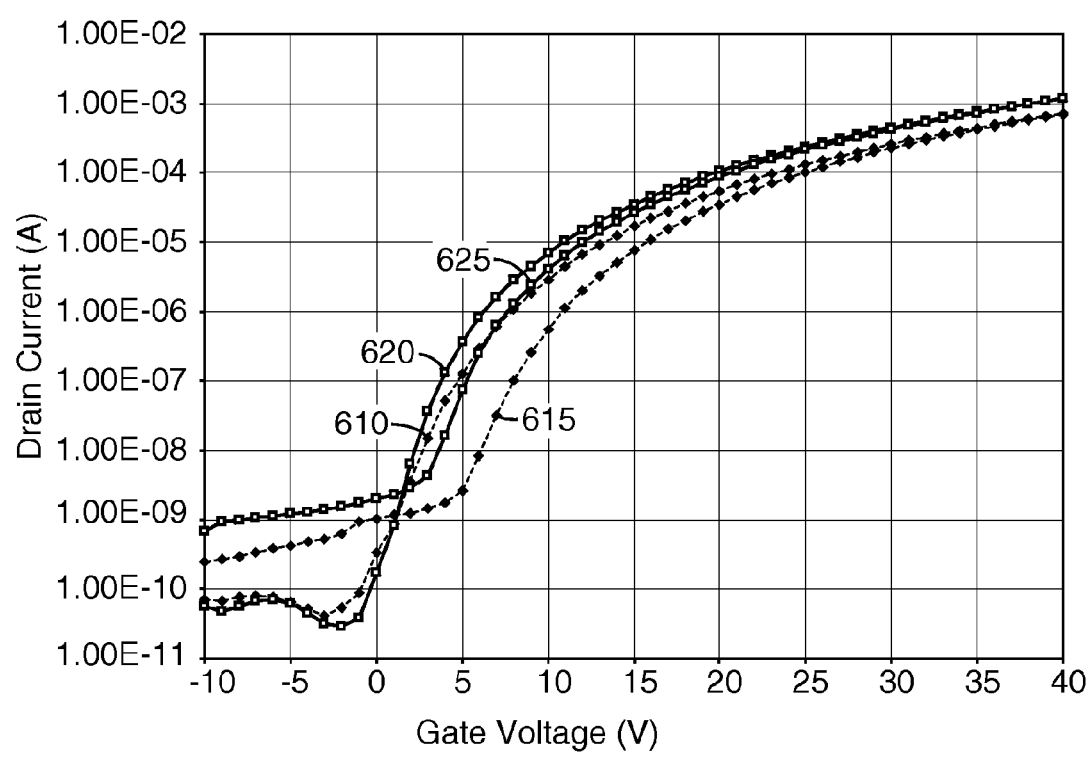
FIG. 6 shows current-voltage plots (forward and reverse sweeps) for a TFT having an anodized $Al_2O_3$ dielectric with a sputtered $SiO_2$ layer which demonstrate the improvement in stability and performance obtained by hydrogen plasma exposure in accordance with embodiments of the invention.

FIG. 6 shows current-voltage transfer characteristics demonstrating the improvement in stability and performance obtained by the hydrogen plasma treatment. The plot shows the current-voltage plots of two TFTs made with 620, 625 and without 610, 615 the Ar—$H_2$ plasma treatment described above. Note the large hysteresis between the forward 610 and reverse 615 current traces for the TFT with no plasma treatment. This instability is manifested as an undesirable positive shift in the threshold voltage. The second set of current traces 620, 625 is from an otherwise identical TFT on the same substrate except that the second TFT was exposed to the Ar—$H_2$ plasma according to the process described herein. Note the minimal hysteresis between the forward 620 and reverse 625 traces for the plasma exposed TFT. The carrier mobility for the hydrogen plasma exposed TFT was also increased over that of the TFT that was not exposed to the hydrogen plasma.

The foregoing description of the various embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method of fabricating a multilayer semiconductor structure, comprising:
    forming an electrode layer;
    forming a dielectric layer proximate to the electrode layer;
    after forming the dielectric layer, exposing the dielectric layer to a hydrogen-containing plasma; and
    after exposing the dielectric layer to the hydrogen-containing plasma, forming a metal oxide semiconductor layer proximate to the dielectric layer
    wherein a hydrogenated region is formed at a semiconductor-dielectric interface of the dielectric layer, the hydrogenated region incorporating hydrogen that decreases in concentration from the semiconductor-dielectric interface into one or both of the dielectric layer and the semiconductor layer.

2. The method of claim 1, wherein forming the dielectric layer comprises anodizing the electrode layer.

3. The method of claim 1, wherein the semiconductor layer comprises ZnO and the dielectric layer comprises $Al_2O_3$.

4. The method of claim 1, wherein forming the electrode layer, forming the dielectric layer, exposing the dielectric layer to the hydrogen-containing plasma, and forming the semiconductor layer are performed in a roll to roll process on a flexible substrate.

5. The method of claim 1, wherein forming the dielectric layer and forming the semiconductor layer are performed at a temperature of less than 100 C.

6. The method of claim 1, wherein the hydrogen-containing plasma comprises about 5% hydrogen.

7. The method of claim 1, wherein the hydrogen-containing plasma comprises deuteruim.

8. The method of claim 1, wherein exposing the dielectric layer to the hydrogen-containing plasma comprises exposing the dielectric layer to at least about 0.01 Watts/$cm^2$ for about 3-5 minutes.

9. The method of claim 1, wherein exposing the dielectric layer to the hydrogen-containing plasma further comprises creating a non-uniform hydrogen concentration profile that decreases from a first level at a first point at a surface of the dielectric layer to a second level at a second point in the dielectric layer farther from the surface.

10. The method of claim 1, wherein:
    forming the multilayer semiconductor structure comprises forming a thin film transistor; and
    exposing the dielectric layer to a hydrogen-containing plasma comprises incorporating hydrogen into a hydrogenated region at a surface of the dielectric, the hydrogenated region including the incorporated hydrogen stabilizing a threshold voltage of the transistor.

11. A method of fabricating a multilayer semiconductor structure, comprising:
    forming an electrode layer;
    forming a dielectric layer proximate to the electrode layer;
    after forming the dielectric layer, processing the dielectric layer to create a hydrogenated region at a surface of the dielectric layer, the hydrogenated region having a non-uniform hydrogen profile wherein a concentration of hydrogen decreases from a first point at a surface of the dielectric to a second point within dielectric layer; and
    forming a metal oxide semiconductor layer proximate to the dielectric layer.

12. The method of claim 11, wherein processing the dielectric layer comprises exposing the dielectric layer to a hydrogen-containing plasma after formation of the dielectric.

13. The method of claim 11, wherein processing the dielectric layer comprises exposing the dielectric layer to a deuterium-containing plasma to create a non-uniform deuterium profile in the dielectric layer wherein a concentration of deuterium decreases from a first point at a surface of the dielectric to a second point within dielectric layer.

14. The method of claim 11, wherein:
    the electrode layer comprises aluminum (Al);
    the dielectric comprises aluminum oxide ($Al_2O_3$); and
    the semiconductor comprises zinc oxide (ZnO).

15. The method of claim 11, wherein processing the dielectric layer comprises increasing a hydrogen concentration at a surface of the dielectric layer, wherein a hydrogen concentration in a bulk of the dielectric layer near an interface between the electrode and the dielectric layer is not substantially increased by the processing.

16. A multilayer semiconductor structure, comprising:
    an electrode;
    a dielectric layer disposed proximate to the electrode;
    a semiconductor layer comprising a metal oxide semiconductor disposed proximate to the dielectric layer; and
    a hydrogenated region at a semiconductor-dielectric interface of the dielectric layer, wherein the hydrogenated region incorporates hydrogen that decreases in concentration from the semiconductor-dielectric interface into one or both of the dielectric layer and the semiconductor layer.

17. The semiconductor structure of claim 16, wherein the hydrogenated region comprises a plasma hydrogenated region.

18. The semiconductor structure of claim 16, wherein the metal oxide semiconductor comprises ZnO and the dielectric comprises aluminum oxide.

19. The semiconductor structure of claim 16, wherein the hydrogen incorporated in the hydrogenated region comprises deuterium.

20. The semiconductor structure of claim 16, further comprising a flexible polymeric substrate, wherein the electrode is disposed on the polymeric substrate.

* * * * *

UNITED STATES PATENT AND TRADEMARK OFFICE
CERTIFICATE OF CORRECTION

PATENT NO. : 8,610,119 B2  Page 1 of 1
APPLICATION NO. : 13/141118
DATED : December 17, 2013
INVENTOR(S) : Steven D Theiss et al.

It is certified that error appears in the above-identified patent and that said Letters Patent is hereby corrected as shown below:

In the Specification:

Column 5
Line 41, Delete "semiconductor" and insert -- semiconductor. --, therefor.

In the Claims:

Column 7
Line 56, In Claim 5, delete "100 C." and insert -- 100° C. --, therefor.

Column 7
Line 60, In Claim 7, delete "deuteruim." and insert -- deuterium. --, therefor.

Column 8
Line 53, In Claim 16, before "both" delete "one or".

Signed and Sealed this
Second Day of September, 2014

Michelle K. Lee
*Deputy Director of the United States Patent and Trademark Office*